(12) United States Patent
Liu et al.

(10) Patent No.: US 9,281,318 B2
(45) Date of Patent: Mar. 8, 2016

(54) THREE DIMENSIONAL MEMORY STRUCTURE

(71) Applicant: Intel Corporation, Santa Clara, CA (US)

(72) Inventors: Haitao Liu, Meridian, ID (US); Chandra V. Mouli, Boise, ID (US); Krishna K. Parat, Palo Alto, CA (US); Jie Sun, Boise, ID (US); Guangyu Huang, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/813,398

(22) Filed: Jul. 30, 2015

(65) Prior Publication Data

US 2015/0333085 A1    Nov. 19, 2015

Related U.S. Application Data

(63) Continuation of application No. 13/786,925, filed on Mar. 6, 2013, now Pat. No. 9,129,859.

(51) Int. Cl.
*H01L 29/76* (2006.01)
*H01L 27/115* (2006.01)
(Continued)

(52) U.S. Cl.
CPC .......... *H01L 27/11582* (2013.01); *G11C 16/06* (2013.01); *H01L 27/1157* (2013.01); *H01L 27/11524* (2013.01); *H01L 27/11556* (2013.01); *H01L 29/04* (2013.01); *H01L 29/16* (2013.01)

(58) Field of Classification Search
CPC ............... H01L 27/11521; H01L 27/11524; H01L 27/11529; H01L 27/11556; H01L 27/11582; H01L 29/66825; H01L 29/66833; H01L 29/7889; H01L 29/7926
USPC ........................ 438/257–267; 257/314–321
See application file for complete search history.

(56) References Cited

U.S. PATENT DOCUMENTS

2001/0019890 A1    9/2001  Arakawa
2009/0242966 A1   10/2009  Son et al.
(Continued)

FOREIGN PATENT DOCUMENTS

KR    10-2010-0053393 A    5/2010
KR    10-2010-0097459 A    9/2010
(Continued)

OTHER PUBLICATIONS

International Search Report and Written Opinion Received for PCT Patent Application No. PCT/US2014/020296, mailed on Jun. 26, 2014, 14 pages.
(Continued)

*Primary Examiner* — Brook Kebede
(74) *Attorney, Agent, or Firm* — Alpine Technology Law Group LLC

(57) ABSTRACT

A method to fabricate a three dimensional memory structure includes forming an array stack, creating a layer of sacrificial material above the array stack, etching a hole through the layer of sacrificial material and the array stack, creating a pillar of semiconductor material in the hole to form at least two vertically stacked flash memory cells that use the pillar as a common body, removing at least some of the layer of sacrificial material around the pillar to expose a portion of the pillar, and forming a field effect transistor (FET) using the portion of the pillar as the body of the FET.

14 Claims, 7 Drawing Sheets

(51) Int. Cl.
  *H01L 29/16* (2006.01)
  *H01L 29/04* (2006.01)
  *G11C 16/06* (2006.01)

(56) References Cited

U.S. PATENT DOCUMENTS

| | | | |
|---|---|---|---|
| 2010/0159657 A1 | 6/2010 | Arai et al. | |
| 2010/0213527 A1* | 8/2010 | Shim | H01L 27/11565 257/314 |
| 2010/0237402 A1 | 9/2010 | Sekine et al. | |
| 2011/0002178 A1 | 1/2011 | Hwang et al. | |
| 2011/0073866 A1* | 3/2011 | Kim | H01L 27/11578 257/69 |
| 2011/0199813 A1 | 8/2011 | Yoo et al. | |
| 2012/0008400 A1 | 1/2012 | Fukuzumi et al. | |
| 2012/0098051 A1 | 4/2012 | Son et al. | |
| 2012/0241842 A1 | 9/2012 | Matsuda | |
| 2012/0299117 A1 | 11/2012 | Lee et al. | |
| 2013/0043521 A1 | 2/2013 | Jung | |
| 2013/0175494 A1 | 7/2013 | Collins et al. | |
| 2014/0003148 A1* | 1/2014 | Sun | H01L 29/7889 365/185.17 |
| 2014/0029352 A1 | 1/2014 | Tanzawa | |
| 2014/0061779 A1 | 3/2014 | Kim et al. | |
| 2014/0167131 A1* | 6/2014 | Lu | H01L 29/7889 257/316 |

FOREIGN PATENT DOCUMENTS

| | | |
|---|---|---|
| KR | 10-2010-0111130 A | 10/2010 |
| KR | 10-2010-0127111 A | 12/2010 |
| KR | 10-2011-0034816 A | 4/2011 |
| KR | 10-2012-0029291 A | 3/2012 |
| WO | 2014/098992 A1 | 6/2014 |
| WO | 2014/138056 A1 | 9/2014 |

OTHER PUBLICATIONS

F. Francasi et al., "Plasma Assisted Dry Etching of Cobalt Silicide for Microelectronics Applications, J Electrochem. Soc", vol. 143, No. 2, Feb. 1996, 1 page.

Williams, K., "Etch Rates for Micromachining Processing-Part II", Journal of Microelectromechanical Systems, vol. 12, No. 6, Dec. 2003, table III, 18 pages.

International Search Report and Written Opinion Received for Patent Application No. PCT/US2013/047002, mailed on Oct. 18, 2013, 9 pages.

International Preliminary Report on Patentability issued in International Application No. PCT/US2014/020296, mailed on Sep. 17, 2015, 11 pages.

* cited by examiner

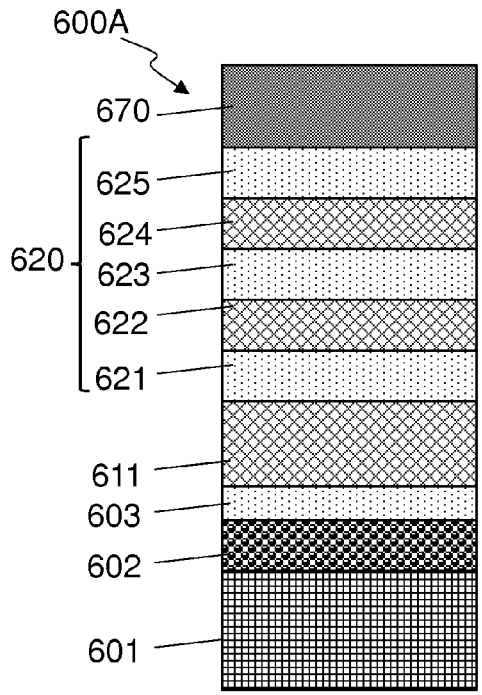
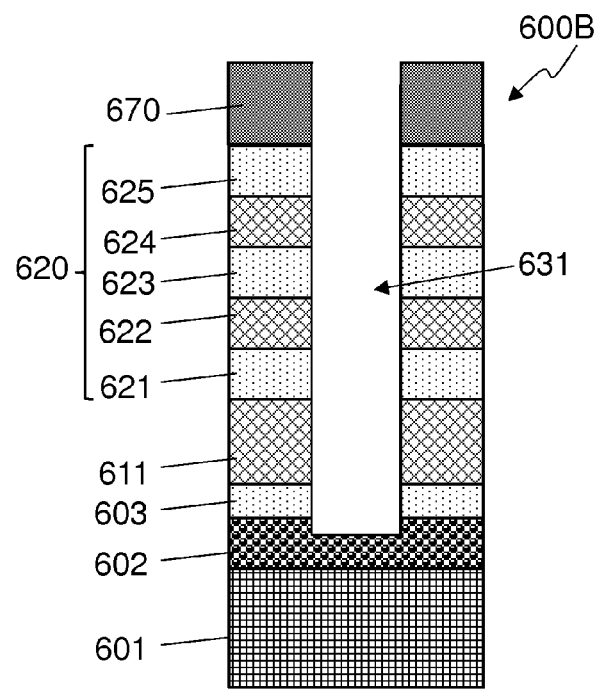
FIG. 6A
FIG. 6B
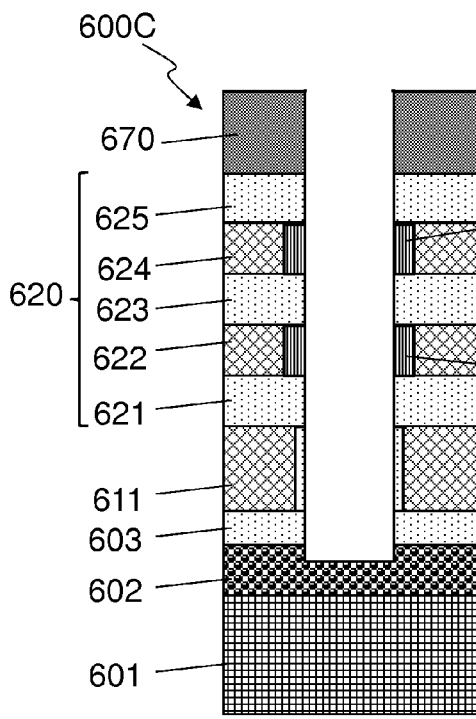
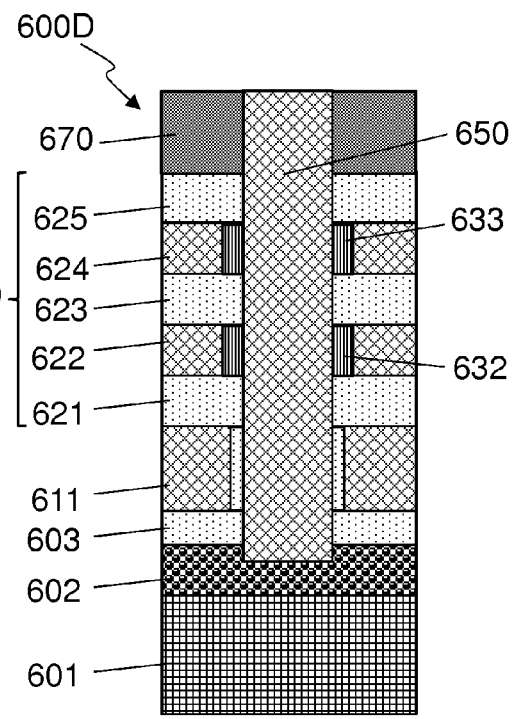
FIG. 6C
FIG. 6D

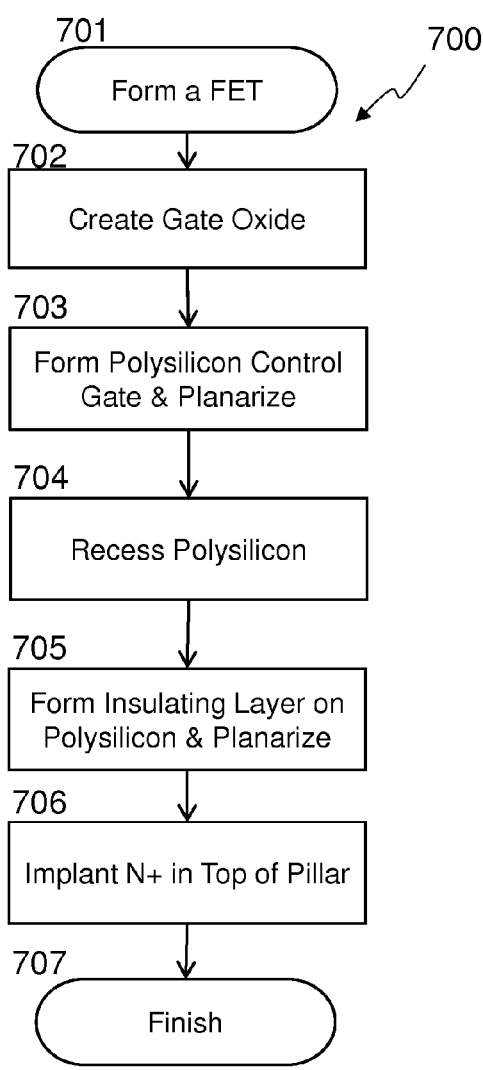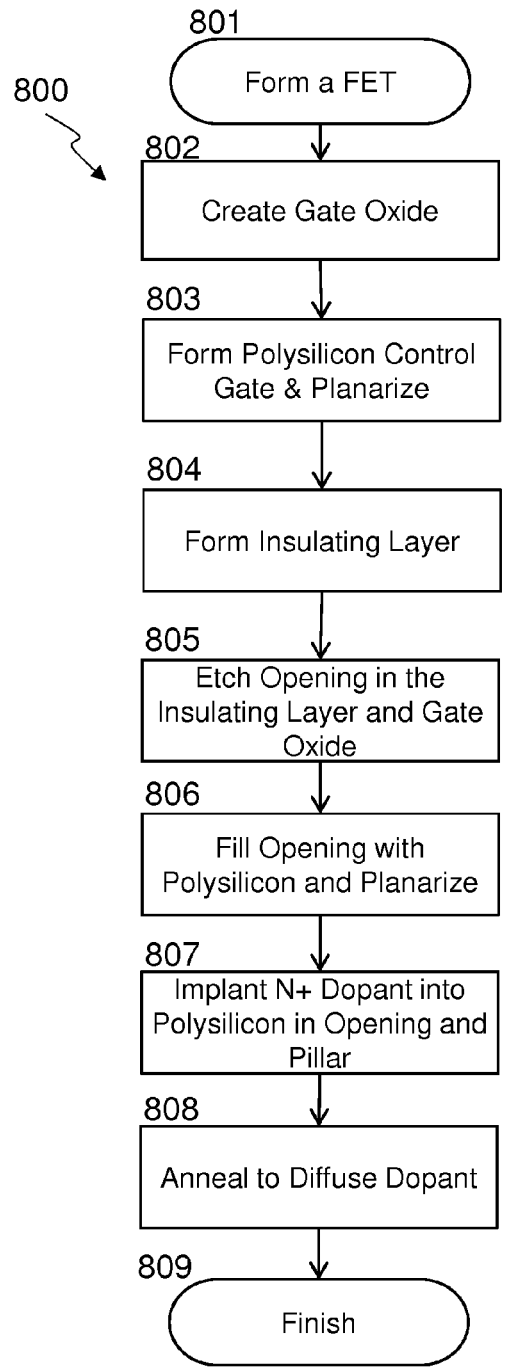

THREE DIMENSIONAL MEMORY STRUCTURE

RELATED APPLICATIONS

This application is a continuation under 35 U.S.C. §120 of U.S. patent application Ser. No. 13/786,925 filed Mar. 6, 2013, to Liu, et al., entitled THREE DIMENSIONAL MEMORY STRUCTURE, the disclosure of which is incorporated herein by reference in its entirety.

BACKGROUND

The present subject matter relates to semiconductor memories, and more specifically, to three-dimensional NAND flash memory arrays.

Many types of semiconductor memory are known. Some memory is volatile and will lose its contents if power is removed. Some memory is non-volatile and will hold the information stored in the memory even after power has been removed. One type of non-volatile memory is flash memory which stores charge in a charge storage region of a memory cell. In a floating gate flash cell, a conductive floating gate, positioned between the control gate and the channel of a metal-oxide silicon field effect transistor (MOSFET), is used to store a charge. In a charge trap flash (CTF) cell, a layer of non-conductive material, such as a nitride film, is used to store charge between the control gate and the channel of a MOSFET. The threshold voltage of the MOSFET-based flash cell can be changed by changing the amount of charge stored in the charge storage region of the cell, and the threshold voltage can be used to indicate a value that is stored in the flash cell.

One architecture in common use for flash memories is a NAND flash architecture. In a NAND flash architecture, two or more flash cells are coupled together, source to drain, into a string, with the individual cell control gates coupled to control lines, such as word lines. Select gates, which may be standard MOSFETs, may be coupled to the NAND string at either end, to couple the NAND string to a source line at one end of the NAND string, and to a bit line at the other end of the NAND string.

Some NAND flash devices may create stacks of flash memory cells in a three-dimensional array of NAND strings. A stack of flash cells may include any number of flash cells with the source, channel, and drain arranged vertically so that as the cells are positioned, one on top of the other, they form a vertical NAND string. The vertical NAND string may be positioned on top of a select gate that may couple the string to a source line and may have another select gate positioned on top of the vertical NAND string to couple the string to a bit line.

BRIEF DESCRIPTION OF THE DRAWINGS

The accompanying drawings, which are incorporated in and constitute part of the specification, illustrate various embodiments. Together with the general description, the drawings serve to explain various principles. In the drawings:

FIG. 6A-H show cross-sectional side views of various stages of the method shown in FIG. 5;

FIG. 7 is a flowchart of an embodiment of a method to form a field effect transistor (FET);

FIG. 8 is a flowchart of an alternate embodiment of a method to form a FET; and

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of this disclosure. These descriptive terms and phrases are used to convey a generally agreed upon meaning to those skilled in the art unless a different definition is given in this specification. Reference now is made in detail to the examples illustrated in the accompanying drawings and discussed below.

Figure 1:
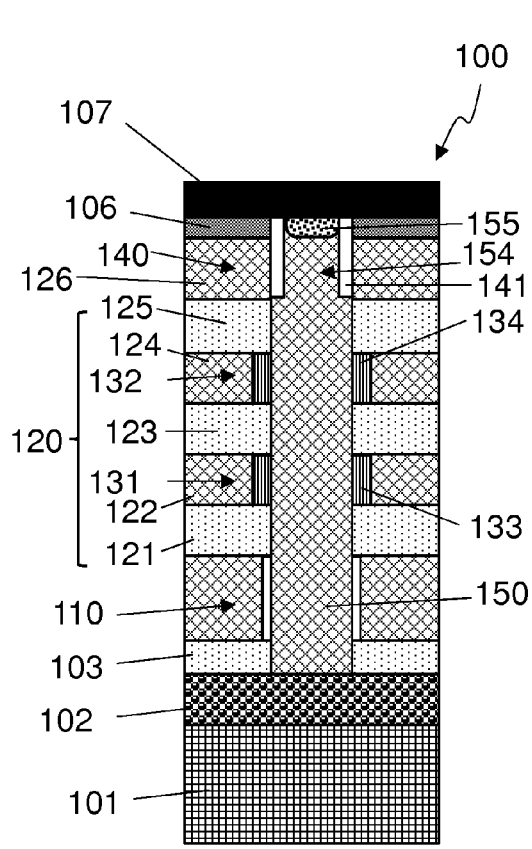
FIG. 1 shows a cross-sectional side view of an embodiment of a three dimensional NAND flash.

FIG. 1 shows a cross-sectional side view of an embodiment of a three dimensional (3D) NAND flash 100. While the physical orientation of the 3D NAND flash 100 may change with respect to gravity, for the purposes of this disclosure and associated claims, a direction toward the plane of the substrate 101, which is perpendicular to the bottom of the page of the drawings in FIG. 1, is deemed to be down. So the view of FIG. 1 is from the side, and if a layer shown in FIG. 1, such as bit line layer 107, is farther from the bottom of the page than another layer, such as source layer 102, that layer, bit line layer 107 in this example, is above the other layer, such as source layer 102. Other cross-sectional drawings should be interpreted similarly.

Figure 2:
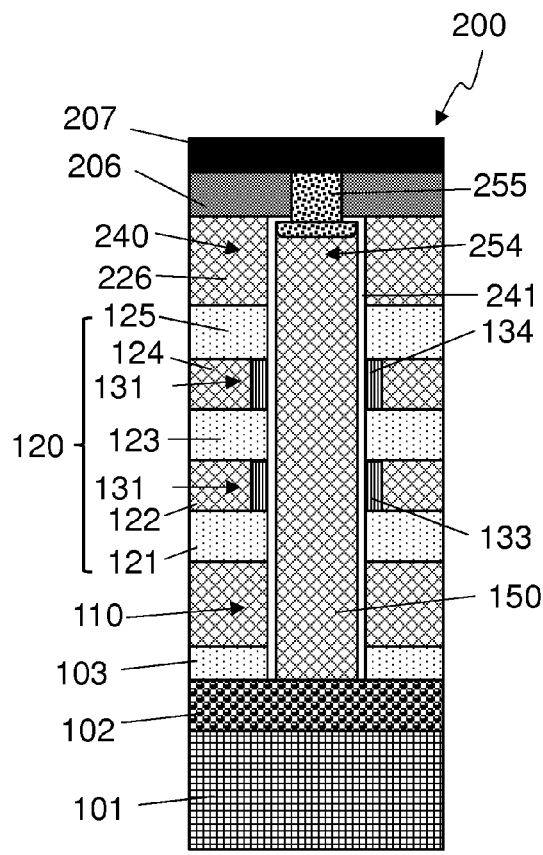
FIG. 2 shows a cross-sectional side view of an alternate embodiment of a three dimensional NAND flash.

FIG. 2 shows a cross-sectional side view of an alternate embodiment of a 3D NAND flash 200. Some of the reference numbers are common with FIG. 1 as the portions with common reference numbers of the 3D NAND flash 200 are identical to the corresponding portions of 3D NAND flash 100.

Figure 3:
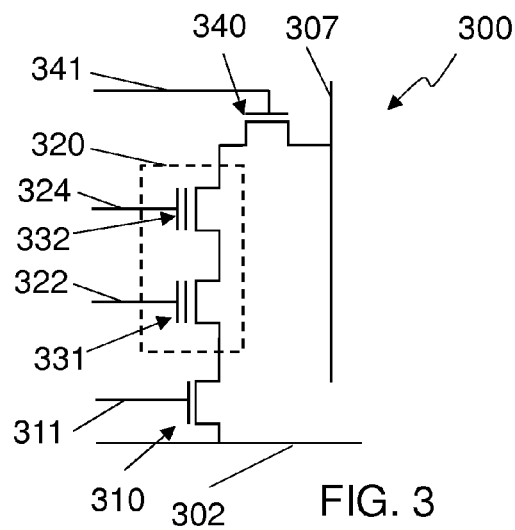
FIG. 3 shows a schematic of the three dimensional NAND flash.

FIG. 3 shows a schematic of the three dimensional NAND flash 300 corresponding to the 3D NAND flash 100 of FIG. 1 or to the 3D NAND flash 200 of FIG. 2. The three figures are discussed concurrently for their common portions, but are discussed individually where the embodiments diverge. The 3D NAND flash memories 100, 200, 300 may be a part of an integrated circuit, such as a NAND flash memory device, a processor, or some other type of integrated circuit.

The 3D NAND flash 100, 200 may be fabricated on a substrate 101, which may be a silicon wafer in some embodiments. The substrate 101 may have various layers, films, patterned areas, doped areas, or other material below the conductive source layer 102 so the substrate 101 may refer to more than simply a raw wafer. Conductive source layer 102 may be used as a source line 302 of a memory array. The conductive source layer 102 may be made of a source line material that is conductive and may be used as an etch stop in some embodiments.

A select gate source (SGS) metal-oxide-semiconductor field effect transistor (MOSFET, or simply FET) 110, which may be represented by FET 310 in FIG. 3, may be fabricated to couple to the conductive source layer 102. The SGS FET 110 may include a control gate fabricated in a conductive select gate source layer, which may be made of any conductive material, but may be made with heavily doped polysilicon in some embodiments. A source control line 311 may couple to the control gate of the SGS FET 110, 310 in the conductive select gate source layer. The select gate source layer may be isolated from the conductive source layer 102 by a first insulating layer 103 which may be made of any insulating material, but in some embodiments, may be an oxide or a nitride. One or more films may form a gate dielectric positioned between material of the select gate source layer and a pillar of semiconductor material 150, which may be used as the body, and/or channel of the SGS FET 110. A pillar of semiconductor material is a structure that is composed chiefly of a semiconductor material that extends through multiple layers of the integrated circuit in a substantially vertical direction.

A pillar 150 may extend through multiple layers of the 3D NAND flash memory 100, 200. The pillar 150 may be any suitable semiconductor material, including, but not limited to, silicon, polysilicon, doped polysilicon, gallium-arsenide (GaAs), or other semiconducting material. The pillar 150 may be a single monolithic pillar of semiconductor material in various embodiments, without any interfaces, seams, or large defects within the pillar 150. The pillar 150 may be created in its entire length by one fabrication process in some embodiments, so that the pillar 150 is relatively uniform in composition throughout its length. The pillar 150 may extend from the source layer 102 in a substantially perpendicular direction, although the angle formed between the pillar 150 and the source layer 102 may not be exactly 90° in every embodiment. The pillar 150 may be tapered, or it may have a relatively constant diameter throughout its height depending on the embodiment. In other embodiments, the pillar 150 may have an irregular diameter, being wider at some layers and narrower at others. The pillar 150 may be roughly circular in cross-section, although other embodiments may have an oval, polygonal, or any other shape cross-section.

A stack of memory cells 120 may be formed on top of the SGS FET 110. The stack of memory cells 120 may be formed vertically, meaning that one memory cell 132 is above another memory cell 131, for a stack of two memory cells. Any number of memory cells may be included in the stack of memory cells 120, which may be shown as the NAND string 320 of FIG. 3. Some embodiments may include $2^n$ memory cells, such as 4, 8, 16, 32 or 64 memory cells in a vertical NAND string. Other embodiments may include a number of memory cells in the NAND string that is not a power of two, and may include memory cells for error correction codes, redundancy, or other purposes. For embodiments with more than two memory cells in the stack of memory cells 120, the vertical orientation of the stack may be interpreted as the second cell being positioned above the first cell, the third cell being positioned above the second cell, and the fourth cell being positioned above the third cell, with additional cells being positioned similarly above the other cells. In some embodiments, the cells may not be positioned exactly one on top of the other, as there may be some embodiments where the various layers may be of different sizes or somewhat off-center from each other, but the cells of the stack of memory cells 120 use the pillar of semiconductor material 150 as a common body and to form their channels.

In some embodiments, the memory cells may be formed using field effect transistors (FETs) 131, 331, 132, 332 having a charge storage mechanism located between a control gate and the channel. The charge storage mechanism 133, 134 may be a conductive floating gate, as may be used in floating gate flash memory, or a charge trapping layer, as may be used in a charge trap flash (CTF) memory, which may also be referred to as a silicon-oxide-nitride-oxide-silicon (SONOS) memory. Either mechanism, or some other mechanism, may be used for embodiments, and is represented generically in the figures. The charge storage mechanisms 133, 134 as well as the gate oxide for the SGS FET may be formed by depositing one or more films inside a hole or opening formed in a work-in-process version of an integrated circuit in which the 3D flash memory is fabricated, for example hole 631 as shown in and described with respect to FIG. 6B, below, and/or etching inside the hole for one or more periods before the polysilicon pillar 150 is formed.

The stack of memory cells 120 may include various layers of material. In the embodiment shown, the stack of memory cells 120 includes alternating insulating layers 121, 123, 125 and conductive layers 122, 124. If more memory cells are included in the stack 120, more layers may be included in the stack 120. Other layers and/or films may be included in some embodiments. The first flash cell 331 of the schematic of FIG. 3 may correspond to the flash cell 131 of FIGS. 1 and 2, and the second flash cell 332 of FIG. 3 may correspond to the flash cell 132 of FIGS. 1 and 2. A first word line 322 of FIG. 3 may be formed in the conductive layer 122, along with a control gate for the flash cell 131, 331, and a second word line 324 of FIG. 3 may be formed in the conductive layer 124, along with a control gate for the flash cell 132, 332. The insulating layers may be made with any type of insulating material. The conductive layers of the stack 120 may be made of any type of conductive material but may be made with doped polysilicon in some embodiments and may be n-doped in at least one embodiment.

The channels of the flash cells 131, 132 may be formed in the pillar 150 acting as a common body. The pillar 150 also couples the flash cells 131, 132 together to form a NAND string of flash cells. By using a pillar of semiconductor material for the channels without a discontinuity between the FETs, defects may have less impact on the current flow through the NAND string and there may be a lower voltage loss through the NAND string as it is conducting. Another parameter that may help decrease the impact of defects on the current flow through the NAND string is decreased dimensional offset. If the offset between layers is reduced, the dimensional offset may be decreased. Some embodiments may have other material in the channel areas of the select gate source FET 110 and/or the flash cells 131, 132, such as inter-poly dielectric films that are not a part of the pillar of semiconductor material 150, but as long as a part of the conductive channel of an activated switching device, such as select gate source FET 110 and/or the flash cells 131, 132, is in the pillar of semiconductor material 150, the channel may be deemed as being formed in the pillar of semiconductor material 150.

A select gate drain (SGD) FET 140, 240, which may be represented by FET 340 in FIG. 3, may be fabricated on top of the stack of memory cells 120. The stack of memory cells 120 topped by the SGD FET may be referred to as a gated vertical NAND string. The SGD FET 140 of FIG. 1 is somewhat different than the SGD FET 240 of FIG. 2, so they will be discussed separately. The SGD FET 140 of FIG. 1 may include a control gate fabricated in a conductive layer 126 which may be made of any conductive material, but may be a doped polysilicon in at least one embodiment. A source control line, corresponding to source control line 341 of FIG. 3, may couple to the control gate of the SGD FET 140 in the conductive layer 126. The conductive layer 126 may be isolated from the bit line 107, which corresponds to the bit line 307 of FIG. 3 by one or more insulating layers 106 which may be made of any insulating material, but in at least some embodiments, may be made of a silicon nitride material. Gate oxide 141 may be positioned between the body 154, located in the pillar 150, and the control gate, located in the conductive layer 126, of the SGD FET 140. In some embodiments the gate oxide 141 may extend down beyond the conductive layer 126, and in some embodiments, may extend the length of the pillar 150. A heavily doped region 155 may be located at the top of the pillar 150 to allow an ohmic contact to be made with the bit line 107. In some embodiments, the doping may be an N+ dopant such as arsenic (As) or phosphorus (P). Heavy doping may be defined as a concentration of about $10^{19}$ atoms per cubic centimeter ($cm^3$) or more.

In some embodiments, the pillar 150 may have a smaller cross-sectional area for the body 154 of the SGD FET 140 than the cross-section area of the common body of the memory cells 131, 132. The pillar 150 may be divided into virtual sections with a first section including the bodies of the two or more stacked flash memory cells 131, 132, and having a first cross-sectional area, a second section having a second cross-sectional area located above the flash memory cells 131, 132, such as the area adjacent to the insulating layer 125, and a third section including the body of the SGD FET 140 having a third cross-sectional area. If the pillar 150 does not have a constant cross-sectional area throughout a section, the cross-sectional area for a section may be the minimum cross-sectional area in that section. In embodiments, the second cross-sectional area is at least as large as the smaller of the first cross-sectional area or the third cross-sectional area. In some embodiments the third cross-sectional area may be larger or smaller than the first cross-sectional area, but in some embodiments, the pillar 150 may maintain a substantially unchanged cross-sectional area through the first section, second section, and third section.

In the embodiment of FIG. 2, a select gate drain (SGD) FET 240, which may be represented by FET 340 in FIG. 3, may be fabricated on top of the stack of memory cells 120. The SGD FET 240 may include a control gate fabricated in the conductive layer 226 which may be made of any conductive material, but may be a doped polysilicon in at least one embodiment. A source control line, corresponding to source control line 341 of FIG. 3, may couple to the control gate of the SGD FET 240 in the conductive layer 226. The conductive layer 226 may be isolated from the bit line layer 207 by one or more insulating layers 206 which may be made of any insulating material, but in at least some embodiments, may be made of a silicon nitride material. Gate oxide 241 may be positioned between the body 254, located in the pillar 150, and the control gate, located in the conductive layer 226, of the SGD FET 240. In some embodiments the gate oxide 241 may extend down beyond the conductive layer 226, and in some embodiments, may extend the length of the pillar 150 as shown. The conductive layer 226 may extend to near the top of the pillar 150, and the gate oxide 241 may extend over at least a portion of the top of the pillar 150, with the insulating layer 206 extending over at least a portion of the top of the pillar 150 in this embodiment. A section of semiconductor material 255 that has been heavily doped may extend through the insulating layer 206. The cross-sectional area of the section of semiconductor material 255 surrounded by the insulating layer 206 may be smaller than the cross-sectional area of the pillar 150 where the body 254 of the SGD FET 240 is formed. The heavily doped region may extend into the top of the pillar 150 and out to the edges of the pillar 150 so that the heavily doped region has a cross-sectional area equivalent to the cross-sectional area of the top of the pillar.

In some embodiments, the pillar 150 may have a smaller cross-sectional area where the SGD FET 240 is formed than the cross-sectional area of the pillar 150 used for the memory cells 131, 132. The pillar 150 may be divided into virtual sections with a first section including the bodies of the two or more stacked flash memory cells 131, 132, and having a first cross-sectional area, a second section having a second cross-sectional area located above the flash memory cells 131, 132, such as the area adjacent to the insulating layer 125, and a third section including the body of the SGD FET 240 having a third cross-sectional area. In embodiments, the second cross-sectional area is at least as large as the smaller of the first cross-sectional area or the third cross-sectional area. In some embodiments the third cross-sectional area may be larger or smaller than the first cross-sectional area, but in some embodiments, the pillar 150 may maintain a substantially unchanged cross-sectional area through the first section, second section, and third section, as shown in FIG. 2.

Figure 4:
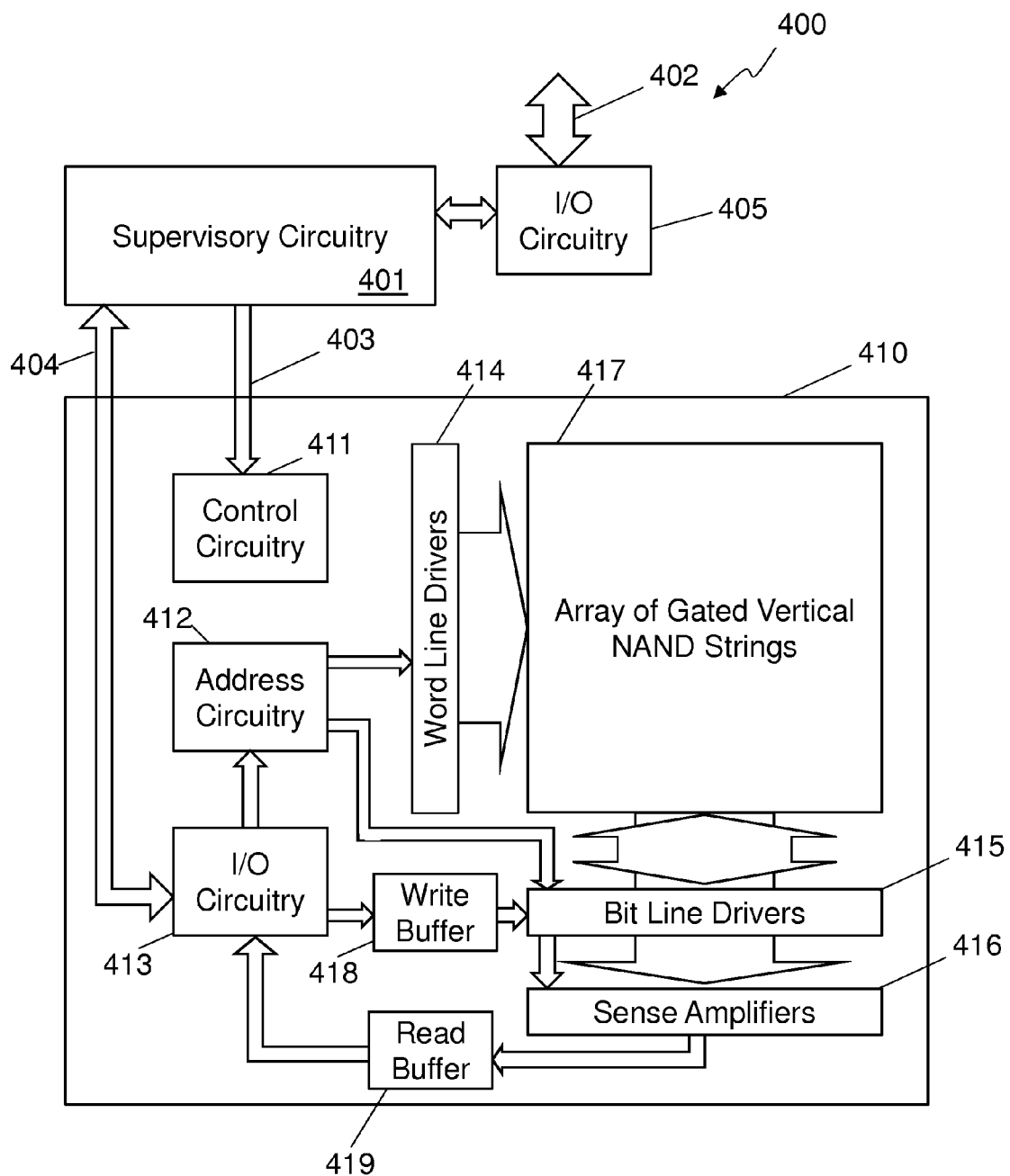
FIG. 4 is a block diagram of an embodiment of an electronic system using a three dimensional NAND flash.

FIG. 4 is a block diagram of an embodiment of an electronic system 400 with memory 410 using gated vertical NAND strings. Supervisory circuitry 401 is coupled to the memory device 410 with control/address lines 403 and data lines 404. In some embodiments, data and control may utilize the same lines. The supervisory circuitry 401 may include a processor, microprocessor, microcontroller, finite state machine, or some other type of controlling circuitry. The supervisory circuitry 401 may execute instructions of a program in some embodiments. In some embodiments, the supervisory circuitry 401 may be integrated in the same package or even on the same die as the memory device 410. In some embodiments, the supervisory circuitry 401 may be integrated with the control circuitry 411, allowing some of the same circuitry to be used for both functions. The supervisory circuitry 401 may have external memory, such as random access memory (RAM) and read only memory (ROM), used for program storage and intermediate data or it may have internal RAM or ROM. In some embodiments, the supervisory circuitry 401 may use the memory device 410 for program or data storage. A program running on the supervisory circuitry 401 may implement many different functions including, but not limited to, an operating system, a file system, memory block remapping, and error management.

In some embodiments an external connection 402 is provided. The external connection 402 is coupled to input/output (I/O) circuitry 405 which may then be coupled to the supervisory circuitry 401 and allows the supervisory circuitry 401 to communicate to external devices. In some embodiments, the I/O circuitry 405 may be integrated with the supervisory circuitry 401 so that the external connection 402 is directly coupled to the supervisory circuitry 401. If the electronic system 400 is a storage system, the external connection 402 may be used to provide an external device with non-volatile storage. The electronic system 400 may be a solid-state drive (SSD), a USB thumb drive, a secure digital card (SD Card), or any other type of storage system. The external connection 402 may be used to connect to a computer or other intelligent device such as a cell phone or digital camera using a standard or proprietary communication protocol. Examples of computer communication protocols that the external connection 402 may be compatible with include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express (PCI-e).

If the electronic system 400 is a computing system, such as a mobile telephone, a tablet, a notebook computer, a set-top box, or some other type of computing system, the external connection 402 may be a network connection such as, but not limited to, any version of the following protocols: Institute of Electrical and Electronic Engineers (IEEE) 802.3, IEEE 802.11, Data Over Cable Service Interface Specification (DOCSIS), digital television standards such as Digital Video Broadcasting (DVB)—Terrestrial, DVB-Cable, and Advanced Television Committee Standard (ATSC), and mobile telephone communication protocols such as Global System for Mobile Communication (GSM), protocols based on code division multiple access (CDMA) such as CDMA2000, and Long Term Evolution (LTE).

The memory device 410 may include an array 417 of gated vertical NAND strings. The gated vertical NAND strings may include a stack of two or more stacked memory cells topped by a FET. The gated vertical NAND strings may be formed using one of the methods described herein, in some embodiments, and the gated vertical NAND strings may be consistent with the 3D NAND flash shown in FIG. 1 or FIG. 2 in some embodiments. Address lines and control lines 403 may be received and decoded by control circuitry 411, I/O circuitry 413 and address circuitry 412 which may provide control to the memory array 417. I/O circuitry 413 may couple to the data lines 404 allowing data to be received from and sent to the processor 401. Data read from the memory array 417 may be temporarily stored in read buffers 419. Data to be written to the memory array 417 may be temporarily stored in write buffers 418 before being transferred to the memory array 417. The array 417 may be controlled by the word line drivers 414, the bit line drivers 415 and the sense amplifiers 416 may be used to determine states of the memory of the array 417.

The system illustrated in FIG. 4 has been simplified to facilitate a basic understanding of the features of the memory. Many different embodiments are possible including using a solid state drive controller as the supervisory circuitry 401 and I/O circuitry 405 to control a plurality of memory devices 410 to act as a solid state drive. Another embodiment may use a processor for the supervisory circuitry 401 and I/O circuitry 405 with additional functions, such as a video graphics controller driving a display, and other devices for human oriented I/O, to implement a personal computer, personal computer or smart phone.

Figure 5:
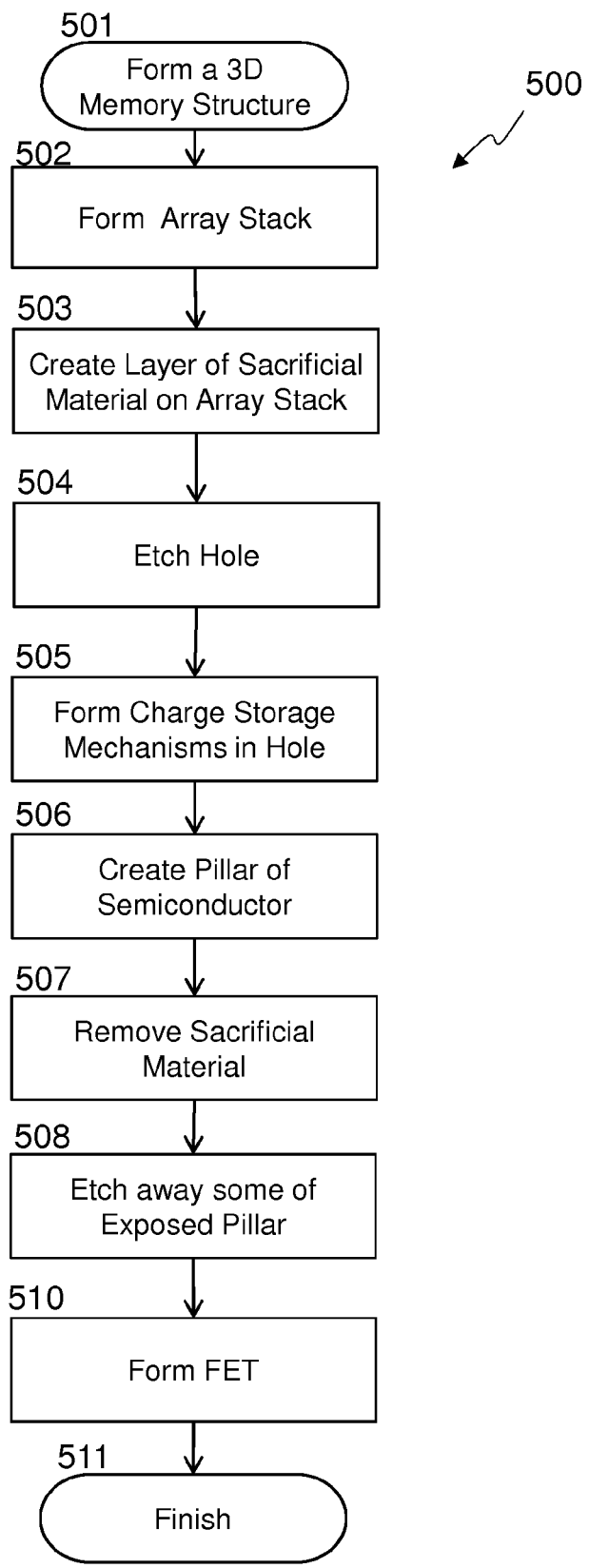
FIG. 5 is a flowchart of an embodiment of a method to fabricate a three dimensional memory structure.

FIG. 5 is a flowchart 500 of an embodiment of a method to fabricate a three dimensional memory structure and FIG. 6A-H show cross sectional side views of various stages of the method shown in FIG. 5. FIG. 5 and FIG. 6A-H are discussed together below. Flowchart 500 may begin to form a 3D memory structure at block 501. A base may be provided that may include a conductive source layer 602 above a substrate 601. As described above, the substrate may include one or more layers and or films of material that may or may not be patterned, before the source layer 602 is created. The conductive source layer 602 may be made of a source material that is conductive and may be suitable for use as an etch stop in some embodiments. In some embodiments, the conductive source layer 602 may be patterned to create various distinct conductors, such as multiple source lines. Patterning may involve multiple processes such as application of a photolithographic material, exposure of the photolithographic material through a mask, and various etching processes, depending on the embodiment.

A first insulating layer 603 may be created above the conductive source layer 602. In one or more embodiments, the term "above" as used herein and/or in the claims may mean that, in at least one example, the conductive source layer 602 is between the substrate 601 and the first insulating layer 603. Creating a layer may be performed by any process or combination of processes, including, but not limited to, deposition of a material, implantation or doping of an existing material, inducing a chemical reaction at the surface of an existing material, or any other process, many of which are well known. A select gate source layer 611 may be deposited above the first insulating layer 603.

An array stack 620 may be formed at block 502 of the flowchart 500 above the substrate 601, such as on the select gate source layer 611. In some embodiments, the array stack 620 may be formed by creating alternating layers of insulating material 621, 623, 625 and conductive material 622, 624 above the select gate source layer 611 as shown in FIG. 6A. In some embodiments, various other layers or films may be included between the alternating insulating layers 621, 623, 625 and conductive layers 622, 624. Patterning, chemical mechanical polishing (CMP) and/or etching processes may be performed at various stages during the formation of the array stack 620. A layer of sacrificial material 670 may be deposited above the array stack 620 at block 503 to create the work-in-process (WIP) integrated circuit (IC) 600A in FIG. 6A. The sacrificial layer 670 may be made of any material but may be a silicon nitride in at least one embodiment.

A hole 631 may be formed at block 504, using etching or various other techniques, through the sacrificial layer 670 and the array stack 620, and in some embodiments, additional layers such as the conductive layer 611 and the insulating layer 603, as shown in WIP IC 600B of FIG. 6B. In at least one embodiment, a single dry etch process may be used to create the hole 631. The hole 631 may be roughly circular in many embodiments although some embodiments may use other shapes.

At block 505, charge storage mechanisms 632, 633 may be formed in the hole 631 to create the WIP IC 500C of FIG. 5C. In some embodiments, one or more films of material may be deposited inside the hole 631, and some embodiments may include etching inside the hole 631 for one or more periods. The depositing and etching may occur after the creation of the hole 631 but before the creation of the pillar 650 of semiconductor material. The charge storage mechanisms 632, 633 may be any type of charge storage mechanism including as a conductive floating gate or a non-conductive charge trapping layer. In one embodiment, an oxide-nitride-oxide (ONO) film may be created in the array stack 620 area and an oxide film to act as a gate oxide may be created in the area of the conductive layer 611 for the SGS FET. In another embodiment, the conductive layers 622, 624 in the array stack 620 may be etched back to create room for polysilicon floating gates, and multiple processes used to create one or more films between the control gates, the floating gates, and the pillar 650.

Figure 6E:
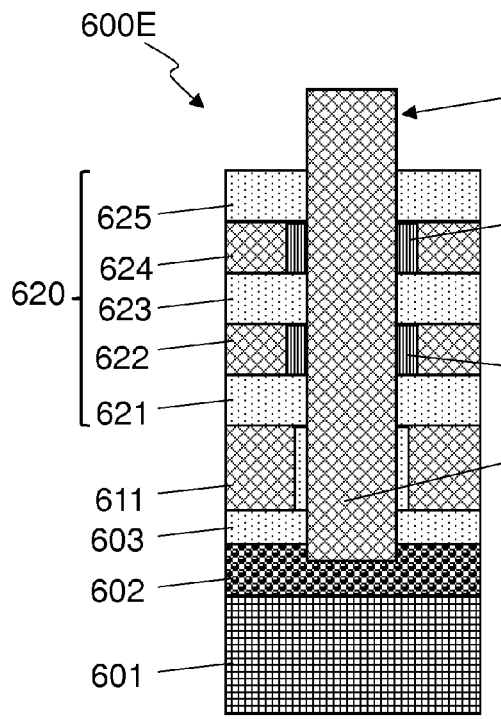

The flowchart 500 may continue at block 506 to create a pillar 650 of semiconductor material in the hole 631 to create the WIP IC 600D of FIG. 6D. The pillar 650 of semiconductor material may be made of polysilicon in some embodiments. The pillar 650 may be a monolithic volume of semiconductor material that extends through the various layers 603, 611, 621-625, 670. At block 507, at least some of the layer of sacrificial material 670 may be removed. In some embodiments, virtually all of the sacrificial layer 670 may be removed, as shown in the WIP IC 600E of FIG. 6E, exposing a portion 651 of the pillar 650. In some embodiments, some of the exposed portion 651 of the pillar 650 may be etched away, as is shown in FIG. 5 at block 508, although some embodiments may not etch away any of the exposed portion 651. At block 510 a FET may be formed above the array stack 620 using a portion of the pillar 650 as the body of the FET, one embodiment of which is shown in FIG. 6F-6H, before finishing at block 511.

Figure 6F:
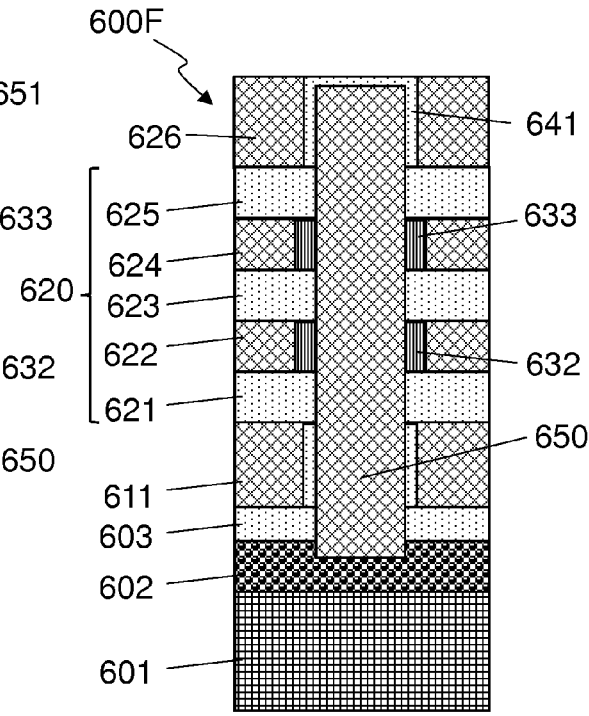
Figure 6G:
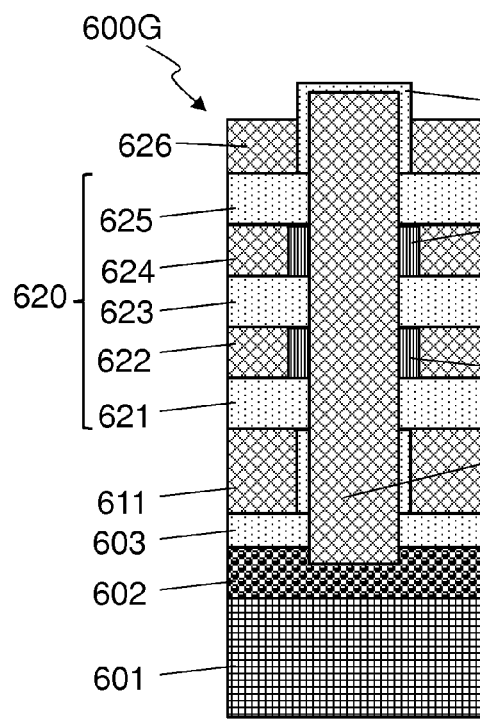
Figure 6H:
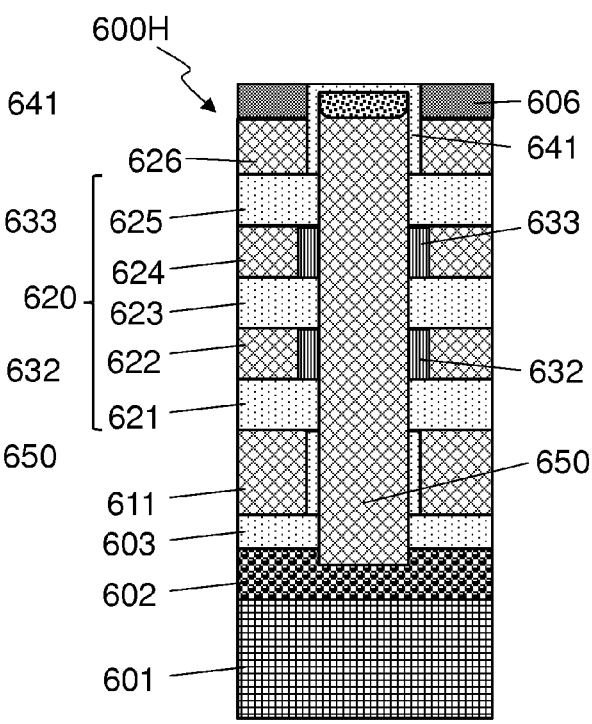

FIG. 7 is a flowchart 700 of an embodiment of a method to form a FET consistent with FIG. 6F-6H and providing detail for one embodiment of block 510 of FIG. 5, although other embodiments may use other methods to form a FET. The flowchart 700 begins at block 701. A gate oxide film 641 may be formed around the exposed portion 651 of the pillar 650 at block 702. At block 703 a polysilicon layer 626 may be formed around the exposed portion 651 of the pillar 650 and planarized using a CMP or other process to form the WIP IC 600F of FIG. 6F. The polysilicon layer 626 may be recessed at block 704, to form the WIP IC 600G of FIG. 6G.

A layer of insulating material 606, which may be a nitride, may be formed at block 705, which may then be planarized, as shown by WIP IC 600H of FIG. 6H, so that the insulating layer 606 is level with the top of the gate oxide 641 covering the top of the pillar 605, although in some embodiments most or all of the gate oxide 641 may be removed by the planarizing processes. The top of the pillar 650 may be implanted with a dopant at block 706. The dopant may be an N+ dopant, such as arsenic (As) or phosphorus (P), and enough dopant may be implanted that the top of the pillar 650 is heavily doped. The flowchart 700 may finish at block 707 with additional layers or processes performed, such as creating bit lines, to complete fabrication of the 3D memory structure.

FIG. 8 is a flowchart 800 of an alternate embodiment of a method to form a FET and provides detail for an alternate embodiment of block 510 of FIG. 5. The SGD FET 240 of the 3D NAND flash of FIG. 2 may be fabricated using the method of flowchart 800. The flowchart 800 may begin at block 801 and may create a gate oxide film on the exposed surfaces of the pillar at block 802. At block 803, a polysilicon layer may be formed around the exposed portion of the pillar and planarized using a CMP or other process. An insulating layer may be formed on top of the planarized surface, including the polysilicon control gate and the top of the pillar at block 804 and an opening may be etched through the insulating layer and gate oxide to the top of the pillar at block 805. The opening may be no larger than the top surface of the pillar and is positioned over the pillar.

The opening may be filled with polysilicon at block 806 and the surface may be planarized again. Filled, does not necessarily imply, herein or in the claims, that the opening is completely full of polysilicon, but merely that polysilicon is located in the opening. The polysilicon in the opening may be implanted with a dopant at block 807. The dopant may be an N+ dopant, such as arsenic (As) or phosphorus (P) and enough dopant may be implanted that the polysilicon in the opening is heavily doped. An annealing process may be performed at block 808 to diffuse the dopant into the pillar and to the edges of the pillar. The flowchart 800 may finish at block 809 with additional layers or processes performed, such as creating bit lines, to complete fabrication of the 3D memory structure.

Figure 9:
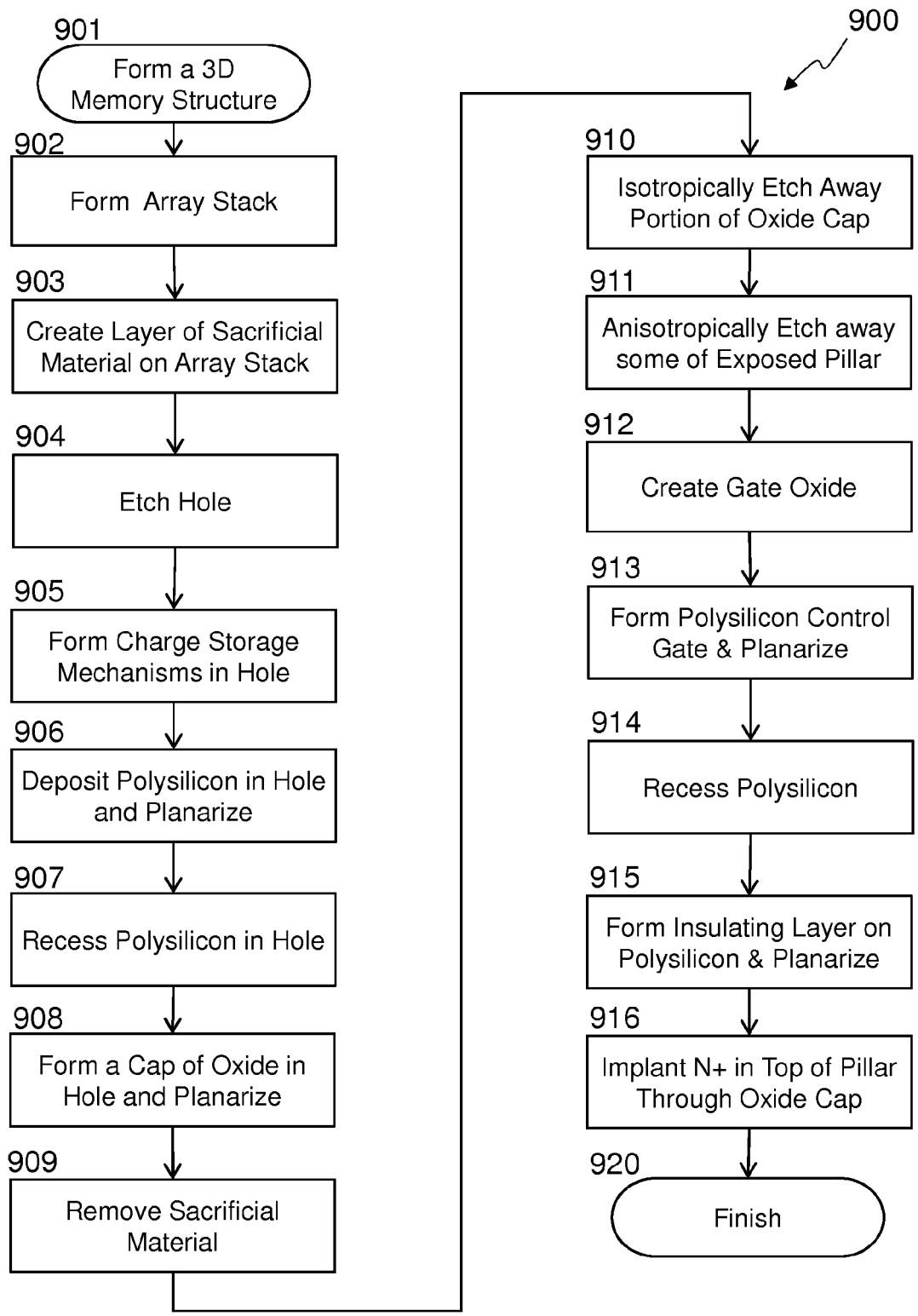
FIG. 9 is a flowchart of an alternate embodiment of a method to fabricate a three dimensional memory structure.

FIG. 9 is a flowchart 900 of an alternate embodiment of a method to fabricate a three dimensional memory structure. While many of the blocks are similar to blocks of the methods described above, some blocks are different or may occur in a different order than in the methods described above. The flowchart 900 may begin to form a 3D memory structure at block 901. A base may be provided that includes a substrate and an array stack may be formed at block 902 above the substrate. A layer of sacrificial material may be deposited above the array stack at block 903, and a hole may be formed at block 904 through at least the sacrificial layer and the array stack. At block 905, charge storage mechanisms, such as a conductive floating gate or a non-conductive charge trapping layer, may be formed in the hole. The flowchart 900 may continue at block 906 to create a pillar of polysilicon in the hole and a planarization may be performed to level the top of the pillar with the sacrificial layer in some embodiments.

In some embodiments, the polysilicon pillar may be recessed back from the surface of the sacrificial layer at block 907 and a cap of oxide may be formed on top of the pillar at block 908. The surface may be planarized and at least some of the layer of sacrificial material removed at block 909 to expose a portion of the pillar. At block 910, the oxide cap may be patterned and at least some of the oxide cap, such as the outer edges of the cap, may be isotropically etched away. An anisotropic etch may then be performed to remove a part of the exposed portion of the pillar not protected by the oxide cap at block 911. The anisotropic etch may make the cross-section of the exposed portion of the pillar smaller than the cross-section of the pillar in the array stack.

In other embodiments, after the polysilicon is created in the hole at block 906, blocks 907 and 908 may be skipped and the sacrificial material removed at block 909 to expose a portion of the pillar without an oxide cap. The exposed portion of the pillar may then be isotropically etched, in place of the etching done in blocks 910 and 911. In some embodiments, no patterning of the top of the pillar may be performed. The isotropic etch removes material on all exposed surfaces of the pillar so that the exposed portion of the pillar is both narrow and shorter. The isotropic etch may also etch away a small amount of the pillar below the level of the top insulating layer of the array stack.

A gate oxide film may then be created on the exposed surfaces of the pillar at block 912 and then a polysilicon control gate may be formed around the exposed portion of the pillar at block 913. The surface may then be planarized in some embodiments. At block 914 the polysilicon may be recessed in some embodiments before an insulating layer is formed on the polysilicon at block 915 and planarized to create a level surface with the cap on top of the pillar. The top portion of the pillar may then be implanted with N+ dopant through the oxide cap at block 916 before the flowchart finishes at block 920.

The flowchart and/or block diagrams in the figures help to illustrate the operation of possible implementations of methods of various embodiments. It should be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

Examples of various embodiments are described in the following paragraphs:

An example method to fabricate a three dimensional memory structure may include forming an array stack, creating a layer of sacrificial material above the array stack, etching a hole through the layer of sacrificial material and at least a portion of the array stack, creating a pillar of semiconductor material in the hole to form at least two vertically stacked flash memory cells that use said pillar as a common body, removing at least some of the layer of sacrificial material around said pillar to expose at least a portion of said pillar, and forming a field effect transistor (FET) using the exposed portion of said pillar as a body of the FET. Some example methods may also include etching away some of the exposed portion of said pillar before the formation of the FET. In some example methods the sacrificial material includes a silicon nitride. In some example methods the semiconductor material includes polysilicon. In some example methods said forming of the FET includes creating a gate oxide film on exposed surfaces of said pillar, forming a polysilicon control gate around the exposed portion of said pillar, forming an insulating layer above the polysilicon control gate, and implanting a top portion of said pillar with an N+ dopant. Some example methods may also include recessing the polysilicon control gate before forming the insulating layer above the polysilicon control gate, and planarizing to level the insulating layer with said pillar. Some example methods may also include recessing said pillar and forming a cap of oxide on top of said pillar before said removing of the at least some of the layer of sacrificial material. Some example methods may also include isotropically etching away a portion of the cap of insulating material to create an etch mask for said pillar, and anisotropically etching away a portion of said pillar not protected by the cap of insulating material before the formation of the FET. In some example methods the semiconductor material includes polysilicon. Some example methods said forming of the FET may include creating a gate oxide film on exposed surfaces of said pillar, forming a polysilicon control gate around the exposed portion of said pillar, planarizing to level the polysilicon control gate with said pillar, forming an insulating layer over the polysilicon control gate and said pillar, etching an opening through the insulating layer, wherein the opening is no larger than a top surface of said pillar, and the opening is positioned over said pillar, filling the opening with polysilicon, and creating a heavily doped region in the polysilicon in the opening and a top portion of said pillar. In some example methods the insulating layer includes silicon nitride. In some example methods said creating of said heavily doped region may include implanting the semiconductor material in the opening with an N+ dopant, and annealing the semiconductor material to diffuse the dopant to edges of said pillar. Some example methods may also include forming charge storage mechanisms in the hole before creating said pillar, wherein a charge storage mechanism includes a conductive floating gate or a non-conductive charge trapping layer. Some example methods may also include depositing one or more films inside the hole, and etching inside the hole for one or more periods. Any combination of the examples of this paragraph may be used in embodiments.

An example integrated circuit (IC) includes a pillar of semiconductor material, two or more stacked memory cells having channels that are formed in said pillar, and a field effect transistor (FET), formed proximate to the two or more stacked memory cells, and having a channel that is formed in said pillar. In some example ICs said pillar has first cross-sectional area where the channel of the FET is formed, and a second cross-sectional area where the channels of the two or more stacked memory cells are formed, and a cross-sectional area of said pillar between the FET and the two or more stacked memory cells is no smaller than the first cross-sectional area or the second cross sectional area. In some example ICs said pillar has a cross-sectional area that is substantially unchanged throughout its length. In some example ICs the first cross-sectional area is smaller than the second cross-sectional area. In some example ICs said pillar includes polysilicon. In some example ICs a top of said pillar is heavily doped. In some example ICs the two or more stacked memory cells comprise a field effect transistor having a charge storage mechanism located between a control gate and the channel, and the charge storage mechanism includes a conductive floating gate or a non-conductive charge trapping layer. In some example ICs the two or more stacked memory cells comprise two or more flash memory cells coupled together into a NAND string, and the FET is coupled to the NAND string to function as a select gate. Any combination of the examples of this paragraph may be used in embodiments.

An example electronic system includes supervisory circuitry to generate memory control commands, or means to generate memory commands, and at least one memory, coupled to the supervisory circuitry, to respond to the memory control commands. The at least one memory may include two or more gated vertical NAND flash strings. A gated vertical NAND string may include a semiconductor pillar comprising a first section with a first cross-sectional area, a second section with a second cross-sectional area, and a third section with a third cross-sectional area, wherein the second section is positioned between the first section and the third section, and the second cross-sectional area is at least as large of the first cross-sectional area or the third cross-sectional area, two or more stacked flash memory cells coupled together to form a NAND string, wherein the first section of the semiconductor pillar includes bodies of the two or more stacked flash memory cells, and a field effect transistor (FET) formed above the two or more stacked flash memory cells, wherein third section of the semiconductor pillar includes a body of the FET. In some example electronic systems the semiconductor pillar includes polysilicon. In some example electronic systems a top of the semiconductor pillar is heavily doped. In some example electronic systems the semiconductor pillar has a cross-sectional area that is substantially unchanged throughout its length. In some example electronic systems the third cross-sectional area is smaller than the first cross-sectional area. Some example electronic systems may also include I/O circuitry, coupled to the supervisory circuitry, to communicate with an external device, or means to communicate with an external device. In some examples the electronic system is a solid state drive.

As used in this specification and the appended claims, the singular forms "a", "an", and "the" include plural referents unless the content clearly dictates otherwise. Furthermore, as used in this specification and the appended claims, the term "or" is generally employed in its sense including "and/or" unless the content clearly dictates otherwise. As used herein, the term "coupled" includes direct and indirect connections. Moreover, where first and second devices are coupled, intervening devices including active devices may be located there between.

The description of the various embodiments provided above is illustrative in nature and is not intended to limit this disclosure, its application, or uses. Thus, different variations beyond those described herein are intended to be within the scope of embodiments. Such variations are not to be regarded as a departure from the intended scope of this disclosure. As such, the breadth and scope of the present disclosure should not be limited by the above-described exemplary embodiments, but should be defined only in accordance with the following claims and equivalents thereof.

What is claimed is:
1. An integrated circuit comprising:
   a substrate;
     a conductive source layer positioned proximate a first surface of the substrate;
   a pillar of semiconductor material electrically coupled to the conductive source layer;

two or more stacked memory cells comprising channels that are formed in the pillar, wherein a segment of the pillar of semiconductor material extends beyond the two or more stacked memory cells; and a field effect transistor (FET) formed proximate to the two or more stacked memory cells, and having a channel that is formed in said pillar, wherein the FET comprises an exposed portion of the segment of the pillar extending beyond the two more stacked memory cells the pillar having a first cross-sectional area where the channel of the FET is formed, and a second cross-sectional area where the channels of the two or more stacked memory cells are formed.

2. The integrated circuit of claim 1, wherein said pillar has a cross-sectional area that is substantially unchanged throughout its length.

3. The integrated circuit of claim 1, wherein the first cross-sectional area is smaller than the second cross-sectional area.

4. The integrated circuit of claim 1, wherein said pillar comprises polysilicon.

5. The integrated circuit of claim 4, wherein a top of said pillar is heavily doped.

6. The integrated circuit of claim 1, wherein the two or more stacked memory cells comprise a field effect transistor having a charge storage mechanism located between a control gate and the channel, and the charge storage mechanism comprises a conductive floating gate or a non-conductive charge trapping layer.

7. The integrated circuit of claim 1, wherein the two or more stacked memory cells comprise two or more flash memory cells coupled together into a NAND string, and the FET is coupled to the NAND string to function as a select gate.

8. An electronic system comprising:
supervisory circuitry to generate memory control commands, and
at least one memory coupled to the supervisory circuitry to respond to the memory control commands, the at least one memory comprising;
a substrate;
a conductive source layer positioned proximate a first surface of the substrate;
a pillar of semiconductor material electrically coupled to the conductive source layer;
two or more stacked memory cells comprising channels that are formed in the pillar, wherein a segment of the pillar of semiconductor material extends beyond the two or more stacked memory cells; and
a field effect transistor (FET) formed proximate to the two or more stacked memory cells, and having a channel that is formed in said pillar, wherein the FET comprises an exposed portion of the segment of the pillar extending beyond the two more stacked memory cells
the pillar having a first cross-sectional area where the channel of the FET is formed, and a second cross-sectional area where the channels of the two or more stacked memory cells are formed.

9. The electronic system of claim 8, wherein the semiconductor pillar comprises polysilicon.

10. The electronic system of claim 9, wherein a top of the semiconductor pillar is heavily doped.

11. The electronic system of claim 8, wherein the semiconductor pillar has a cross-sectional area that is substantially unchanged throughout its length.

12. The electronic system of claim 8, wherein the third cross-sectional area is smaller than the first cross-sectional area.

13. The electronic system of claim 8, further comprising:
I/O circuitry, coupled to the supervisory circuitry, to communicate with an external device.

14. The electronic system of claim 8, wherein the electronic system is a solid state drive.

* * * * *